United States Patent
Rogers et al.

(10) Patent No.: US 10,061,380 B2
(45) Date of Patent: *Aug. 28, 2018

(54) REPORT UPDATED THRESHOLD LEVEL BASED ON PARAMETER

(71) Applicant: HEWLETT-PACKARD DEVELOPMENT COMPANY, L.P., Houston, TX (US)

(72) Inventors: Keith A. Rogers, Spring, TX (US); Lee Warren Atkinson, Houston, TX (US); Ricardo Marquez, Houston, TX (US); Craig A. Walrath, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 209 days.

This patent is subject to a terminal disclaimer.

(21) Appl. No.: 15/159,956

(22) Filed: May 20, 2016

(65) Prior Publication Data

US 2016/0266641 A1    Sep. 15, 2016

Related U.S. Application Data

(63) Continuation of application No. 14/354,305, filed as application No. PCT/US2011/058316 on Oct. 28, 2011, now Pat. No. 9,360,917.

(51) Int. Cl.
*G06F 1/32* (2006.01)
*G06F 1/28* (2006.01)
(Continued)

(52) U.S. Cl.
CPC ....... *G06F 1/3296* (2013.01); *G01R 31/3606* (2013.01); *G06F 1/28* (2013.01);
(Continued)

(58) Field of Classification Search
CPC . G06F 1/32; G06F 1/3203; G06F 1/30; G06F 1/3215; G06F 1/3221;
(Continued)

(56) References Cited

U.S. PATENT DOCUMENTS 5,559,990 A    9/1996 Cheng et al.
5,600,230 A *  2/1997 Dunstan ............... H02J 7/0004
                                         320/DIG. 21
(Continued)

FOREIGN PATENT DOCUMENTS

CN    101609359    12/2009
EP    0819999      4/2004
TW    I319487      1/2010

OTHER PUBLICATIONS

International Searching Authority, Appl. No. PCT/US2011/058316, filed Oct. 28, 2011, Search Report and Written Opinion, 10pp, Jul. 31, 2012.

*Primary Examiner* — Jawreed A Abbaszadeh
*Assistant Examiner* — Brian J Corcoran
(74) *Attorney, Agent, or Firm* — HPI Patent Department (57) ABSTRACT

Example embodiments disclosed herein relate to reporting a first updated threshold level related to a battery. A parameter related to power to be drawn by the computing device for the first OS to enter a hibernate state is monitored. The first updated threshold level are set based on the parameter. The first updated threshold level is reported to the first OS. The first OS is to vary the first battery level threshold based on the first updated threshold level.

20 Claims, 6 Drawing Sheets

(51) Int. Cl.
*G06F 1/30* (2006.01)
*G01R 31/36* (2006.01)
*G06F 9/4401* (2018.01)

(52) U.S. Cl.
CPC .............. *G06F 1/30* (2013.01); *G06F 1/3212* (2013.01); *G06F 9/4418* (2013.01)

(58) Field of Classification Search
CPC .............. G06F 1/3268; G01R 31/3648; G01R 31/3655; G01R 31/3662; G01R 31/3682; H02J 7/0004; H04W 52/0258
See application file for complete search history.

(56) References Cited

U.S. PATENT DOCUMENTS

| | | | |
|---|---|---|---|
| 5,682,273 A | 10/1997 | Hetzler | |
| 5,822,600 A * | 10/1998 | Hallowell | G06F 1/30 713/340 |
| 5,920,728 A | 7/1999 | Hallowell et al. | |
| 6,049,884 A * | 4/2000 | Tsuji | G06F 1/3203 307/66 |
| 6,058,059 A | 5/2000 | Huang et al. | |
| 6,065,122 A | 5/2000 | Wunderlich et al. | |
| 6,169,387 B1 | 1/2001 | Kaib | |
| 6,425,087 B1 * | 7/2002 | Osborn | G06F 1/28 713/340 |
| 6,571,343 B1 | 5/2003 | Johnson et al. | |
| 6,879,259 B1 * | 4/2005 | Smith | G01R 31/3648 340/636.1 |
| 7,028,220 B2 * | 4/2006 | Park | G06F 1/30 320/127 |
| 7,225,353 B1 * | 5/2007 | Wong | G06F 1/30 713/300 |
| 7,484,110 B2 | 1/2009 | Stufflebeam | |
| 7,716,504 B2 | 5/2010 | Nijhawan et al. | |
| 2004/0088589 A1 * | 5/2004 | Westerinen | G06F 1/30 713/300 |
| 2006/0069458 A1 | 3/2006 | Lee et al. | |
| 2009/0144577 A1 * | 6/2009 | Sarker | G06F 1/3225 713/340 |
| 2010/0131785 A1 | 5/2010 | Blackburn et al. | |
| 2011/0093725 A1 | 4/2011 | Theocharous et al. | |
| 2012/0122526 A1 * | 5/2012 | Bockus | H04W 52/0258 455/572 |

* cited by examiner

REPORT UPDATED THRESHOLD LEVEL BASED ON PARAMETER

CROSS REFERENCE TO RELATED APPLICATION

This is a continuation of U.S. application Ser. No. 14/354,305, filed Apr. 25, 2014, which is a national stage application under 35 U.S.C. § 371 of PCT/US2011/058316, filed Oct. 28, 2011, both hereby incorporated by reference.

BACKGROUND

Mobile devices, such as notebook computers, may be powered by a battery. Software, such as an operating system (OS) running on the mobile device, may gauge an actual remaining battery capacity of the battery. Should the actual remaining battery capacity fall below a battery level threshold, the OS may enter an inactive state, such as a hibernate state. Before entering the hibernate state, the OS may carry out operations to preserve data, such as saving data of a volatile memory to a non-volatile memory of the mobile device.

The battery level threshold is set by the OS to ensure that the actual remaining battery capacity of the battery is sufficient to power a transition of the mobile device to the hibernate state.

BRIEF DESCRIPTION OF THE DRAWINGS

The following detailed description references the drawings, wherein.

DETAILED DESCRIPTION

Specific details are given in the following description to provide a thorough understanding of embodiments. However, it will be understood by one of ordinary skill in the art that embodiments may be practiced without these specific details. For example, systems may be shown in block diagrams in order not to obscure embodiments in unnecessary detail. In other instances, well-known processes, structures and techniques may be shown without unnecessary detail in order to avoid obscuring embodiments.

Devices, such as notebook computers or tablet computers, may be powered by a battery. These devices often run software, such as an operating system (OS), which monitors an actual remaining battery capacity of the battery through an Advanced Configuration and Power Interface (ACPI). The ACPI may provide an interface between the OS and hardware and/or firmware, such as the basic input/output system (BIOS), to allow the OS to control a power state of the device. For example, the OS may compare the actual remaining battery capacity received via the BIOS and/or ACPI to a battery level threshold to determine if the actual remaining battery capacity of the battery is low. When the actual remaining battery capacity falls below the battery level threshold, the OS may enter an inactive state, such as a hibernate state. The hibernate state may refer to an inactive state in which contents of a volatile memory, such as a RAM, are written to a non-volatile memory, such as a hard disk drive, before powering down one or more components of the device, such as the RAM. When the OS wakes from the hibernate state, the contents of the volatile memory are reloaded, such as to the RAM, and the device is restored to its state previous to entering the hibernate state.

A manufacturer may determine the battery level threshold and then apply the battery level threshold to an entire platform of one or more devices. If the battery level threshold is set to too low, the battery may not have sufficient energy to power a transition of the OS to the hibernate state. Thus, the battery level threshold is often set conservatively to a relatively high level to ensure that that the battery stores sufficient energy to power a transition of the OS to the hibernate state. However, as a result, the battery may still retain enough energy to have powered the OS for a longer time before entering the hibernate state. Hence, the OS may prematurely enter the hibernate state, thus reducing a time the device is in the active state and usable by a user.

Accordingly, various embodiments dynamically vary at least one of a actual remaining battery capacity of the battery reported to the OS and a battery level threshold of the OS based on an estimated power to be drawn by the device in order to maximize or extend a time before the device is to enter the hibernate state. For example, embodiments may monitor parameters such as an amount of memory to be saved, an age and condition of the device, a speed and temperature of components of the device, complexity of software running on the device, the capacity of the battery and the like. These parameters may be used to increase or decrease a value of the actual remaining battery capacity reported to the OS and/or the battery level threshold of the OS, in order to delay a time before the OS is to enter the hibernate state and to maximize or extend an active state of the OS.

Figure 1:
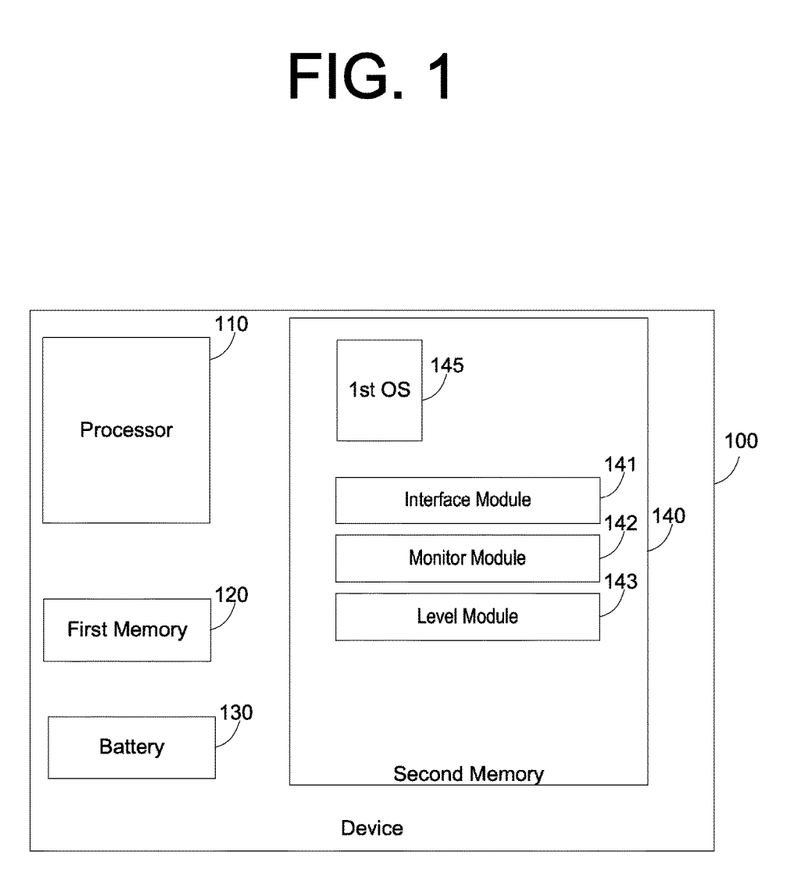
FIG. 1 is an example block diagram of a computing device to report at least one of a first modified remaining battery capacity and a first updated threshold level to a first operating system.

Referring now to the drawings, FIG. 1 is an example block diagram of a computing device 100. In one embodiment the computing device 100 can report a modified remaining battery capacity to the first OS 145. In another embodiment the computing device can report a first updated threshold level to a first OS 145. In another embodiment the computing device 100 can report either or both of the modified remaining battery capacity and a first updated threshold level to a first OS 145. Embodiments of the computing device 100 may include, for example, a notebook computer, a desktop computer, an all-in-one system, a slate computing device, a portable reading device, a wireless email device, a mobile phone, and the like. In the embodiment of FIG. 1A, the computing device 100 includes a processor 110, a first memory 120, a battery 130 and a second memory 140. The second memory 140 further includes an interface module 141, a monitor module 142, a level module 143 and the first OS 145.

The battery 130 may include any type of power storage device, such as a rechargeable battery. For example, the battery may be a dry cell type battery having cells that include nickel-cadmium (NiCd), nickel-zinc (NiZn), nickel metal hydride (NiMH), lithium-ion (Li-ion), and the like. The computing device 100 may be powered by the battery 130, such as when a power outlet (not shown) is not available. Further, the battery 130 may also be recharged via the power outlet.

The actual remaining battery capacity of the battery 130 may be reported by a chip (not shown) of the battery 130 which estimates a remaining power or energy of the battery 130, such as via coulomb counting or voltage detection methods. Further, the actual remaining battery capacity may be expressed as a percentage of the total power capacity of the battery, a number of milliwatt hours, and the like.

The first and second memories 120 and 140 may be one or more machine-readable storage mediums such as any electronic, magnetic, optical, or other physical storage device that contains or stores executable instructions. Further, the first memory 120 may be a volatile type of memory, such as random access memory (RAM), including dynamic random access memory (DRAM) and static random access memory (SRAM). The second memory 140 may be a non-volatile type of memory, such as read-only memory, flash memory, magnetic computer storage devices like hard disks, floppy disks, magnetic tape, optical discs, etc.

The processor 110 may be a CPU, a GPU, or a microprocessor suitable for retrieval and execution of instructions from the second memory 140 and/or electronic circuits configured to perform the functionality of any of the modules 141 to 143 described below. For example, when one or more components of the computing device 100 are powered down, such as during the hibernate state, any information stored in the first memory 120 may be lost. Thus, the processor 110 may store information of the first memory 120 to a location of the second memory 140 before the first OS 145 is to enter the hibernate state. The term OS may refer to one or more programs that manage hardware resources, such as that of the first and second memories 120 and 140, and/or support software applications.

Each of the modules 141 to 143 may include, for example, hardware devices including electronic circuitry for implementing the functionality described below. In addition to or as an alternative, each module may be implemented as a series of instructions encoded on a machine-readable storage medium and executable by the processor 110. In embodiments, some of the modules 141 to 143 may be implemented as hardware devices, while other modules are implemented as executable instructions.

The modules 141 to 143 may be implemented as part of an application run by an OS, such as the first OS 145, and/or part of the ACPI. The interface module 141 is to receive a first battery level threshold from the first OS 145 running on the computing device 100 powered by the battery 130. The monitor module 142 is to monitor a actual remaining battery capacity of the battery 130 and a parameter related to power to be drawn by the computing device 100 for the first OS 145 to enter the hibernate state.

The parameter monitored by the monitor module 142 may relate to a size and type of the information to be saved, a speed and reliability of at least one of the first and second memories 120 and 140, a speed and temperature of the processor 110, a capacity and age of the battery 130, and/or the like. Thus, the parameter may vary with operation of the computing device 100. For example, a value of the parameter may vary according to an amount of information stored at the first memory 120, such as a RAM, and/or a temperature of the processor 110 at a given instance in time during which the computing device 100 is in a powered on state. The computing device 100 may include a sensor (not shown) to monitor the temperature of the processor 110. The parameter will be explained in greater detail below with respect to FIGS. 4-5B.

The level module 143 is to extend a time before the first OS 145 is to enter a low power state for example the hibernate state by setting at least one of the first modified remaining battery capacity and the first updated threshold level. The first modified remaining battery capacity is set based on the received first battery level threshold, the monitored actual remaining battery capacity and the parameter. The first updated threshold level is to be set based on the parameter. Further, the interface module 141 is to report at least one of the first modified remaining battery capacity and the first updated threshold level to the first OS 145.

The first OS 145 is to enter the hibernate state if the first modified remaining battery capacity is less than the first battery level threshold and the first OS 145 is to vary the first battery level threshold based on the first updated threshold level. For example, if the first updated threshold level is lower than the first battery level threshold, the first battery level threshold may be set to a lower level, thus delaying a time before the first OS 145 is to enter the hibernate state. Also, if the first modified remaining battery capacity is greater than the actual remaining battery capacity, the first OS 145 may wait longer to enter the hibernate state than if the first OS 145 had compared first battery level threshold to the actual remaining battery capacity of the battery 130.

The interface module 141 may report the actual remaining battery capacity of the battery 130 to the first OS 145 if the interface module 141 does not report first modified value to the first OS 145. The first OS 145 may interpret either of the reported first modified remaining battery capacity and the actual remaining battery capacity to be the actual remaining power of the battery 130. Hence, the first OS 145 may enter the hibernate state if the actual remaining battery capacity of the battery 130 or the first modified remaining battery capacity is reported as less than the first battery level threshold.

For example, the first battery level threshold may be 4% of the battery capacity and the first modified remaining battery capacity may be set by the level module 143 to be, for example, 2% greater than the actual remaining battery capacity of the battery 130. If the first modified remaining battery capacity is reported to the first OS 145, the first OS 145 may not enter hibernate state until the first modified remaining battery capacity is 4%. Therefore, if the actual remaining battery capacity is 3% and the first modified remaining battery capacity is 5%, the computing device 100 may not enter the low power state. Hence, reporting the first modified remaining battery capacity instead of the actual remaining battery capacity of the battery 130, can increase a time the first OS 145 is usable by a user and delay a time until the first OS 145 is to enter the hibernate state.

In an alternative embodiment, the first updated threshold level may be used to set the first battery level threshold to a different value. For example, if the reported first updated threshold level is 2%, the first OS 145 may change the first battery level threshold from 4% to 2%, thus allowing the first OS 145 to delay entering the hibernate state until the actual remaining battery capacity of the battery 130 or the first modified remaining battery capacity is reported as less than 2%.

The modules 141 to 143 may continuously monitor the actual remaining battery capacity and the parameters to dynamically vary at least one of the first modified remaining battery capacity and the first updated threshold level. An operation of the modules 141 to 143 will be explained in greater detail with respect to FIG. 3.

Further, the first OS 145 may also enter a sleep state upon receiving a sleep command from the user or from the first OS 145 if the first OS 145 is idle for a threshold time period. The sleep state may be similar to the hibernate state, except a volatile memory, such as the first memory 120, may remain powered. Should the actual remaining battery capacity of the battery 130 become low during the sleep state, the first OS 145 may need to save temporary data, such as contents of first memory 120, that would be lost if the computing device 100 powered down to an off state. However, the first OS 145 may not have an ability to save temporary data during the sleep state nor have an ability to directly transition to the hibernate to save the temporary data. Instead, the OS 145 may transition from the sleep state to an active state before entering the hibernate state.

Therefore, the OS 145 may not enter the sleep state unless the actual remaining battery capacity of the battery 130 is sufficient to both wake from sleep state and to transition to the hibernate state. Thus, in this case, the first OS 145 may enter a sleep state if the interface module 141 receives a sleep command and the first modified remaining battery capacity is greater than or equal to the first battery level threshold. The level module 143 may set the first modified remaining battery capacity such that a reserve of the battery 130 is sufficient to power the first OS 145 to enter and wake from the sleep state before entering the hibernate state.

While FIG. 1 shows the modules 141 to 143 and the first OS 145 to be stored at a single memory location, such as the second memory 140, embodiments are not limited thereto. For example, the modules 141 to 143 may be stored at a separate memory from the second memory 140 or at a separate partition, either physical or logical, of the second memory 140.

Figure 2:
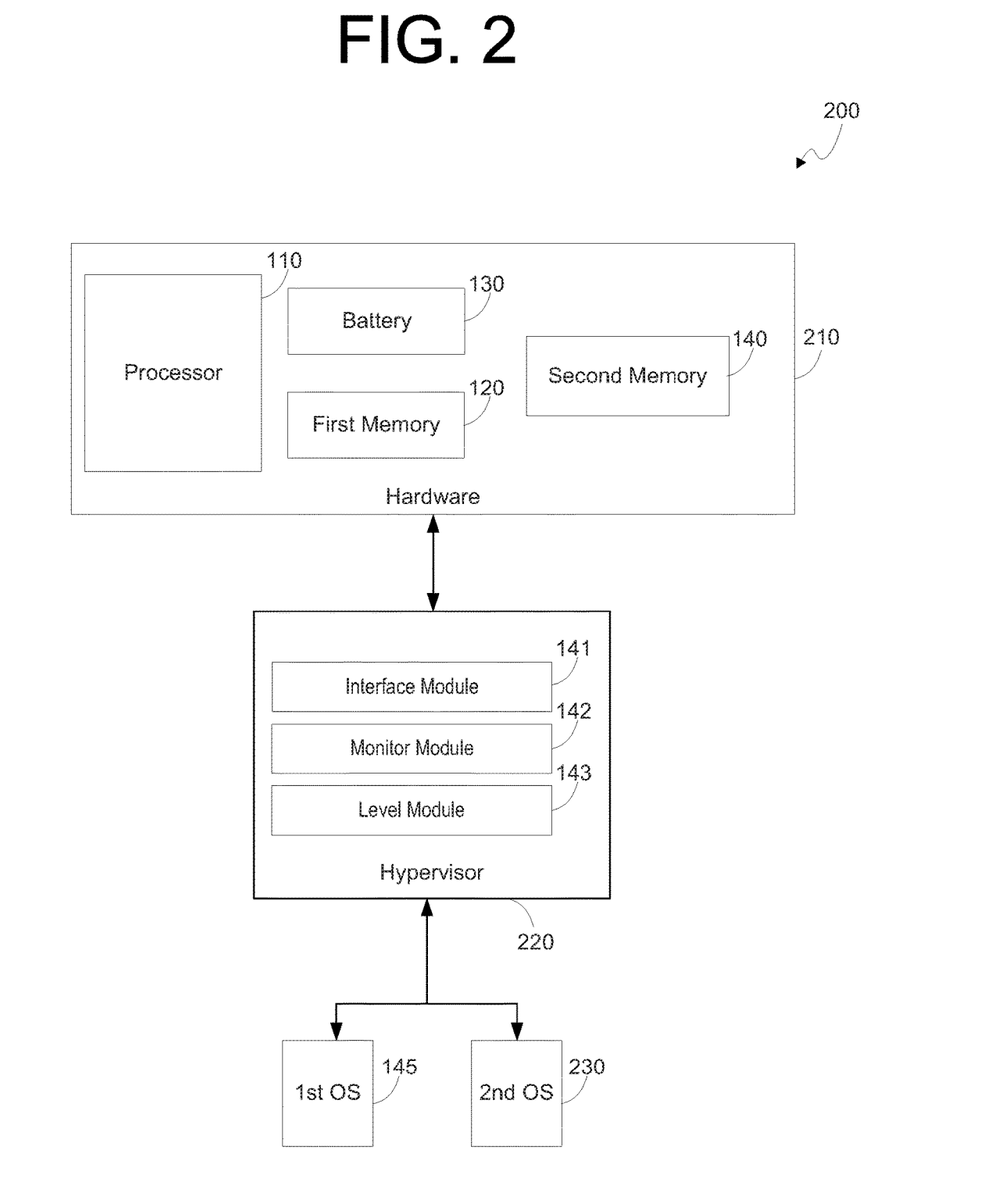
FIG. 2 is an example block diagram of a system to report at least one of a first modified remaining battery capacity and a first updated threshold level to a first operating system and at least one of a second modified remaining battery capacity and a second updated threshold level to a second operating system.

FIG. 2 is an example block diagram of a system 200 to report at least one of a first modified remaining battery capacity and a first updated threshold level to a first operating system 145 and at least one of a second modified remaining battery capacity and a second updated threshold level to a second operating system 230. The system 200 of FIG. 2 may include components similar to that of the computing device 100 of FIG. 1A. For example, the system 200 has hardware 210 including the processor 110, the first memory 120, the battery 130 and the second memory 140. Further, system 200 includes the interface module 141, the monitor module 142, the level module 143 and the first OS 145. However, the system 200 also includes a second OS 230 and a hypervisor 220 that includes the modules 141 to 143. While the hypervisor 220 and the first and second OSs 145 and 230 are shown to be separate from the hardware 210, embodiments may also include the hypervisor 220 and the first and second OSs 145 and 230 being internal to the hardware 210, such as the second memory 140.

The first and second OSs 145 and 230 may both be a same type of OS or each may be different types of OSs, such as any one of a Windows OS, a Linux OS, a Unix OS, and the like. Moreover, each of the first and second OSs 145 and 230 may be assigned to one or more different users. For example, the hardware 210 may be a server in which the first OS 145 is assigned to a first user and the second OS 230 is assigned to a second user.

In this embodiment, the modules 141 to 143 may be part of a type of software that allows the hardware 210 to run a plurality of OSs, where first OS 145 and second OS 230 may be virtual machines that are managed by the hypervisor 220. The hypervisor 220 may interface between the hardware 210, such as the first memory 120 and the battery 130, and the virtual machines, such as the first OS 145 and/or the second OS 230. The hypervisor 220 may include any type of hardware virtualization technique that allows multiple OSs to run concurrently as guests on a host device, such as the hardware 210 or the hypervisor could be an OS itself. A functionality of the hypervisor 220 may be flexible and determined according to a user's or manufacturer's specification. For example, the hypervisor 220 may launch and monitor the first OS 145 and/or the second OS 230, such as via a process of the hypervisor 220.

Similar to FIG. 1, the hypervisor 220 may report at least one of the first modified remaining battery capacity and the first updated threshold level to the first OS 145. In addition, the hypervisor 220 may report at least one of the second modified remaining battery capacity and the second updated threshold level to the second OS 230. The second OS 230 is to enter the hibernate state if the second modified remaining battery capacity is less than a second battery level threshold of the second OS. Further, the second OS is to vary the second battery level threshold based on the second updated threshold level.

When there are multiples OSs, such as the first OS 145 and the second OS 230, running concurrently on the hardware 210, all of the components of the hardware 210 may not enter the hibernate state if one of the first OS 145 and the second OS 230 does not enter the hibernate state. Instead, for example, the hypervisor 220 may determine which, if any components of the hardware 210 are to be accessed and/or powered down as a result of at least one of the first OS 145 and the second OS 230 entering the hibernate state. For instance, the hypervisor 220 may allow contents of the first memory 120 related to the first OS 145 to be saved to the second memory 140 when the first OS 145 is to enter the hibernate state. However, the hypervisor 220 may retain contents of the first memory 120 related to the second OS 230 if the second OS 230 is to not enter the hibernate state.

One of the first OS 145 and second OS 230 may not be aware that the battery 130 is being shared with another of the first OS 145 and second OS 230. The hypervisor 220 may set the first and second modified remaining battery capacities to allocate the actual remaining battery capacity of the battery 130 between the first OS 145 and the second OS 230. For example, the hypervisor 220, via the level module 143, may evenly split the actual remaining battery capacity of the battery 130 between the between the first and second modified remaining battery capacities. Alternatively, the hypervisor 220 may monitor parameters, such as a rate of activity or power consumption of at least one of the first and second OSs 145 and 230, to aid in setting the first and second modified remaining battery capacities and/or the first and second updated threshold levels. An operation of the modules 141 to 143 with respect to multiple OSs, such as the first and second OSs 145 and 230, will be explained in greater detail with respect to FIGS. 5A and 5B. Further, embodiments of the hardware 210 may include more or less virtual machines than described in the implementation.

Figure 3:
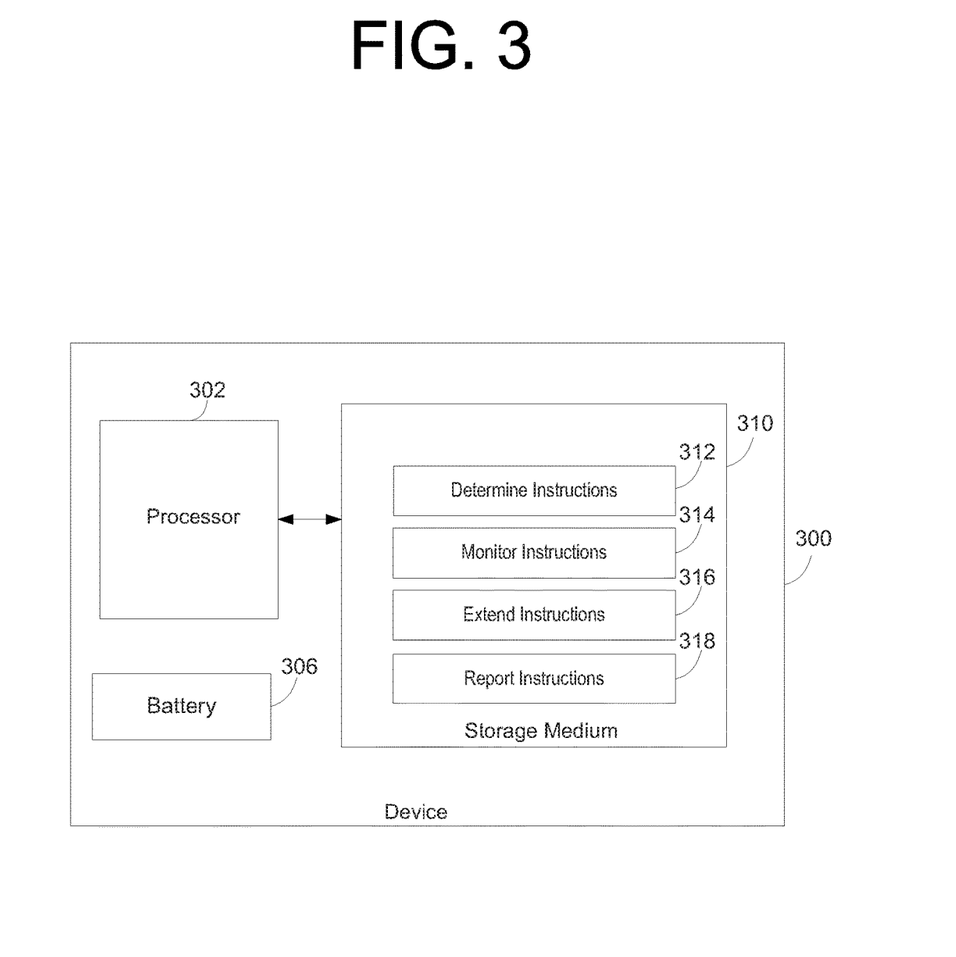
FIG. 3 is an example block diagram of a computing device including instructions for reporting at least one of a first modified remaining battery capacity and a first updated threshold level to a first operating system.

FIG. 3 is an example block diagram of a computing device 300 including instructions for reporting at least one of a first modified remaining battery capacity and a first updated threshold level to a first OS. In the embodiment of FIG. 3, the computing device 300 includes a processor 302, a battery 306 and a machine-readable storage medium 310 including instructions 312, 314, 316 and 318 for reporting at least one of the first modified remaining battery capacity and the first updated threshold level to the first OS (not shown).

The computing device 300 may be, for example, a chip set, a notebook computer, a slate computing device, a portable reading device, a wireless email device, a mobile phone, or any other device capable of executing the instructions 312, 314, 316 and 318. In certain examples, the computing device 300 may include or be connected to additional components such, memories, sensors, displays, etc. For example, the computing device 300 may include a first memory (not shown) and a second memory (not shown) to store one or more OSs.

The processor 302 may be, at least one central processing unit (CPU), at least one semiconductor-based microprocessor, at least one graphics processing unit (GPU), other hardware devices suitable for retrieval and execution of instructions stored in the machine-readable storage medium 310, or combinations thereof. The processor 302 may fetch, decode, and execute instructions 312, 314, 316 and 318 to implement the setting and reporting of at least one of the first modified remaining battery capacity and the first updated threshold level to the first OS 145. As an alternative or in addition to retrieving and executing instructions, the processor 302 may include at least one integrated circuit (IC), other control logic, other electronic circuits, or combinations thereof that include a number of electronic components for performing the functionality of instructions 312, 314, 316 and 318.

The machine-readable storage medium 310 may be any electronic, magnetic, optical, or other physical storage device that contains or stores executable instructions. Thus, the machine-readable storage medium 310 may be, for example, Random Access Memory (RAM), an Electrically Erasable Programmable Read-Only Memory (EEPROM), a storage drive, a Compact Disc Read Only Memory (CD-ROM), and the like. As such, the machine-readable storage medium 310 can be non-transitory. As described in detail below, machine-readable storage medium 310 may be encoded with a series of executable instructions for setting and reporting of at least one of the first modified remaining battery capacity and the first updated threshold level to the first OS.

Figure 4:
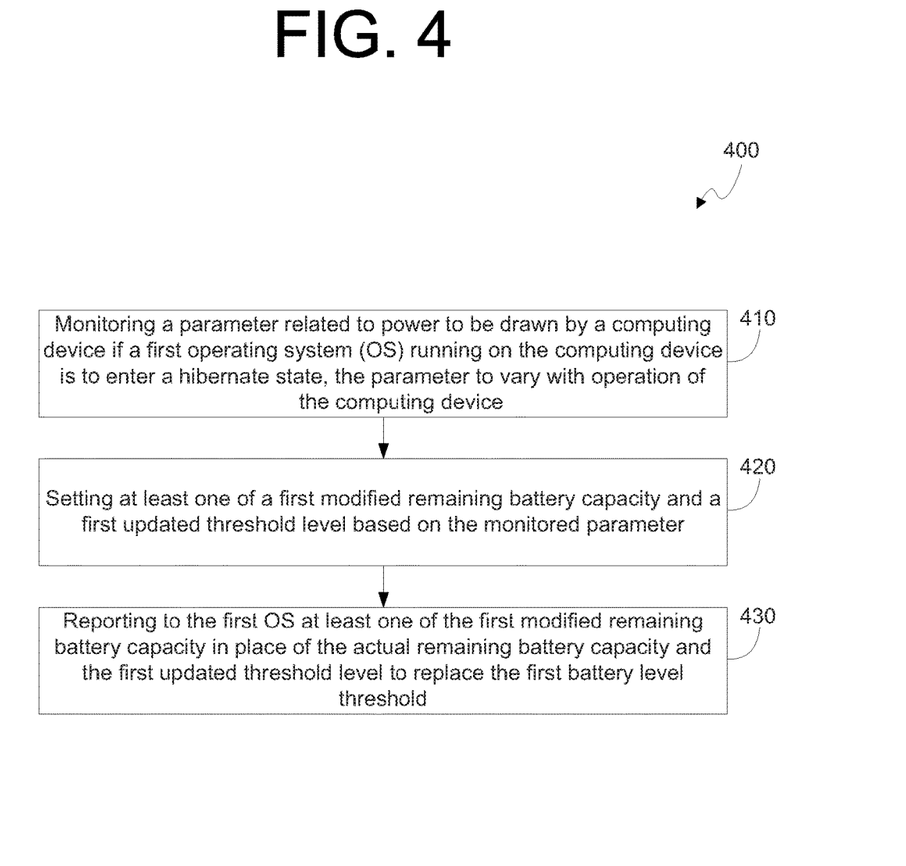
FIG. 4 is an example flowchart of a method for reporting at least one of a first modified remaining battery capacity and first updated threshold level to a first operating system.
Figure 5A:
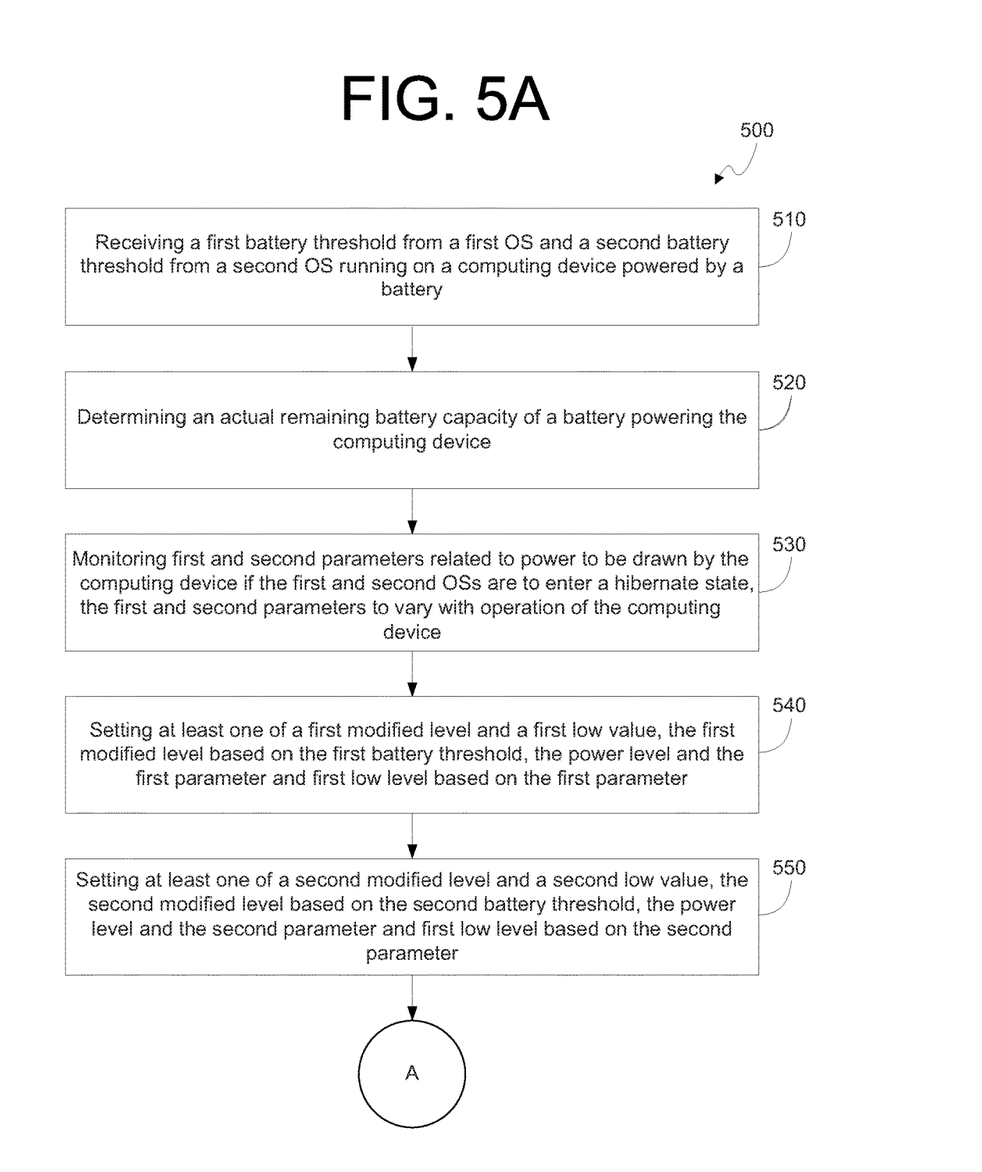
FIGS. 5A and 5B are an example flowchart of a method for reporting at least one of first and second modified remaining battery capacities and first and second updated threshold levels to first and second operating systems.
Figure 5B:
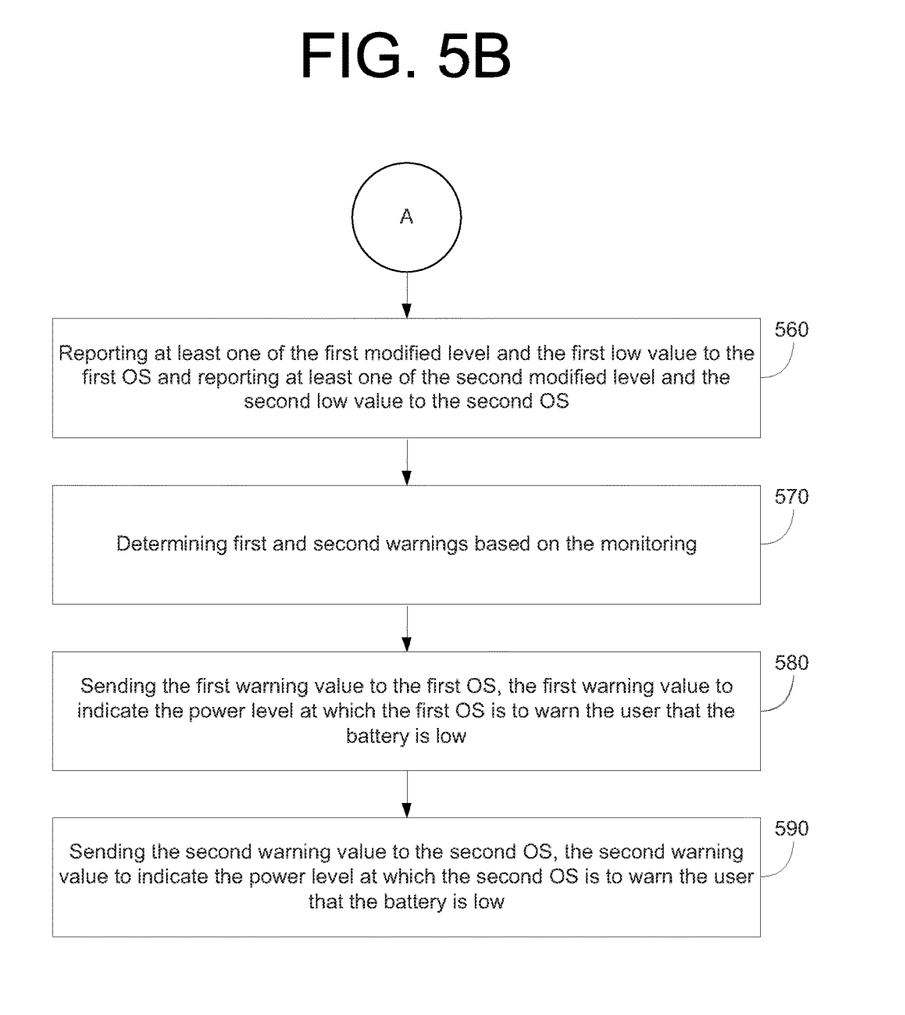

Moreover, the instructions 312, 314, 316 and 318 when executed by a processor (e.g., via one processing element or multiple processing elements of the processor) can cause the processor to perform processes, such as, the process of FIG. 4 or 5A and 5B. For example, the determine instructions 312 may be executed by the processor 302 to determine a first battery level threshold from the first OS running on the computing device 300 powered by the battery 306. The monitor instructions 314 may be executed by the processor 302 to monitor an actual remaining battery capacity of the battery 306 and a parameter related to power drawn by the computing device 300 for the first OS to transition to a hibernate state. The parameter may vary with operation of the computing device 300.

The extend instructions 316 may be executed by the processor 302 to a time before the first OS is to enter the hibernate state by setting at least one of a first modified remaining battery capacity and a first updated threshold level, the first modified remaining battery capacity to be set based on the determined first battery level threshold, the monitored actual remaining battery capacity and the parameter and the first updated threshold level to be set based on the parameter. The report instructions 318 may be executed by the processor 302 to report at least one of the first modified remaining battery capacity and the first updated threshold level to the first OS, the first OS to enter the hibernate state if the first modified remaining battery capacity is less than the first battery level threshold and the first OS to vary the first battery level threshold based on the first updated threshold level.

The machine-readable storage medium 310 may also include instructions (not shown) to determine to determine and report at least one a second modified remaining battery capacity and a second updated threshold level for a second OS, as described in more detail with respect to FIGS. 5A and 5B.

FIG. 4 is an example flowchart of a method 400 for reporting at least one of a first modified remaining battery capacity and first updated threshold level to a first OS. Although execution of the method 400 is described below with reference to the computing device 100, other suitable components for execution of the method 400 can be utilized, such as the system 200 or the device 300. Additionally, the components for executing the method 400 may be spread among multiple devices (e.g., a processing device in communication with input and output devices). In certain scenarios, multiple devices acting in coordination can be considered a single device to perform the method 400. The method 400 may be implemented in the form of executable instructions stored on a machine-readable storage medium, such as storage medium 310, and/or in the form of electronic circuitry.

The computing device 100 receives a first battery level threshold from the first OS 145 running on the computing device 100 powered by the battery 130. The computing device 100 also determines an actual remaining battery capacity of the battery 130. At block 410, the computing device 100 monitors a parameter related to power to be drawn by the computing device 100 if a first OS running on the computing device is to enter a hibernate state, the parameter to vary with operation of the computing device 100. The blocks may be carried out in a different order and/or simultaneously.

At block 420, the computing device 100 sets at least one of the first modified remaining battery capacity and the first updated threshold level based on a parameter. The first modified remaining battery capacity may be further set based on the first battery level threshold and the actual remaining battery capacity. At block 430, the computing device 100 reports to first OS 145 at least one of the first modified remaining battery capacity in place of the actual remaining battery capacity and the first updated threshold level to replace the first battery level threshold. The first OS 145 is to enter the hibernate state if the reported first modified remaining battery capacity or actual remaining battery capacity is less than the first battery level threshold and the first OS 145 is to vary the first battery level threshold based on the first updated threshold level. Further, the first OS 145 is to enter a sleep state if the first OS 145 receives the sleep command and the reported first modified remaining battery capacity or actual remaining battery capacity is greater than or equal to the first battery level threshold. As noted above, the computing device 100 may report the actual remaining battery capacity instead of the first modified remaining battery capacity, such as when the computing device 100 is already reporting the first updated threshold level.

While the computing device 100 sets the first modified remaining battery capacity to extend a time before the first OS 145 is to enter the hibernate state, the computing device 100 also sets the first modified remaining battery capacity such that a reserve of the battery 130 is sufficient to power the first OS 145 to enter and wake from the sleep state before entering the hibernate state. For instance, the computing device 100 may monitor the parameter and determine that the computing device 100 may safely transition to the hibernate state with only a 2% actual remaining battery capacity of the battery 130. However, the first battery level threshold of the first OS 145 may be 5%. Thus, in order to maximize or extend a time before the first OS 145 is to enter the hibernate state, the computing device 100 may report the first modified remaining battery capacity as 3% greater than the actual remaining battery capacity. Thus, the first OS 145 will enter the hibernation state only when the actual remaining battery capacity is 2%, and not 5%. Alternatively or in addition, the computing device 100 may set the first updated threshold level to 2%. The first OS 145 may then change the first battery level threshold to 2% upon receiving the reported first updated threshold level.

In one embodiment, monitoring the parameter may include monitoring an amount of information from a memory to be saved, with the computing device 100 to set the first modified remaining battery capacity to vary relative to the actual remaining battery capacity based on the amount of information to be saved. For example, at block 410, the computing device 100 may monitor the information to be saved from the first memory 120 to the second memory 140 before entering the hibernate state. In this case, the computing device 100 may estimate or determine an amount of power needed to save the information, such as by determining an amount of power to be drawn by the first and second memories 120 and 140 and the processor 110, while transferring the information from the first memory 120 to the second memory 140. A larger amount of information to be saved may require a larger amount of power.

The computing device 100 may also determine other types of parameters, as explained below, related to power drawn by the computing device 100 before it is to enter the hibernate state. The power to be drawn, as determined by these various parameters, may be added together to determine a minimum actual remaining battery capacity for the first OS 145 to enter the hibernate state. Next, the computing device 100 may compare the minimum actual remaining battery capacity to the first battery level threshold of the first OS 145. If the minimum actual remaining battery capacity is less than the first battery level threshold, the computing device 100 may set the first modified remaining battery capacity to be greater than the actual remaining battery capacity of the battery 130 and/or set the first updated threshold level to the minimum actual remaining battery capacity, which may be lower than the first battery level threshold, at block 420, in order to delay a time before computing device 100 is to enter the hibernation state. For example, the minimum actual remaining battery capacity may be smaller with the less amount of information there is to be saved from the first memory 120 to the second memory 140.

The information stored at the first memory 120 is separate from and usually less than a physical amount of memory installed, such as the storage capacity of the first memory 120. The first OS 145 and/or the second OS 230 may distinguish between several types of the information stored at the first memory 120, such as hardware reserved, in use, modified, standby, and free types of the information. The hardware reserved type of information may be dynamically used by drivers of at least one of the first and second OSs 145 and 230, to store a momentary context of components of the system 200. The in use type of information may be a cache of read-only data that was fetched from another memory, such as the second memory 140. The modified type of information may represent user data, such as data that has been modified by an application used by the user, but which has not been stored back to another memory, such as the second memory 140. The standby type of information may represent speculatively fetched locations of another memory, such as the second memory 140, that have been written to the first memory 120 to assist in the faster loading of applications. The free type of information may represent an unused or empty part of the first memory 120.

The standby and free types of information of the OS to enter the hibernate state, such as the first or second OS 145 or 230, may be discarded and not saved to the second memory 140 by the system 200. At least some of the hardware reserved type of information may be also be discarded depending on whether one or both of the first OS 145 and the second OS 230 are to enter the hibernate state. The in use type of information may also represent redundant type of information to be saved to the second memory 140 and the modified type of information may also represent non-redundant type of information to be saved to the second memory 140.

Further, the redundant type of information to be saved to the second memory 140 may also include any duplicate information between the first and second OSs 145 and 230. For example, if the first and second OSs 145 and 230 are the same type of OS or instances thereof, at least some of the hardware reserved, in use, or even possibly the modified type of information may be duplicative between the first and second OSs 145 and 230.

A second example parameter that may be monitored by the computing device 100 at block 410 includes priorities of the redundant and non-redundant types of the information to be saved. The priority may refer to an order the information is to be saved, with the information having a greater priority being saved before information having a lower priority. As noted above, the redundant type of information may include read-only data stored at the first memory 120 that was fetched from the second memory 140. As such, there may be duplicate copies of the redundant type information stored at both the first and second memories 120 and 140. The non-redundant information may be data that is only stored at the first memory 120, such as data modified or generated by hardware, an application, a user, and the like.

Thus, in the event that the computing device 100 was unable to store all of the non-redundant information before entering the hibernate state, such as if the battery 130 drained beforehand, information would be lost. On the other hand, if the computing device 100 was unable to store all of the redundant information before entering the hibernate or shutdown state, information may not be lost. Therefore, at block 420, the computing device 100 may further set the first modified remaining battery capacity to vary relative to the actual remaining battery capacity and/or set the first updated threshold level, based on an amount or percentage of the non-redundant type of the information having a greater priority than that of the redundant type of information. For example, the computing device 100 may set the first modified remaining battery capacity to be greater than the actual remaining battery capacity and/or set the first updated threshold level to be lower than the first battery level threshold, if all or a majority of the non-redundant type of the information is to be saved before the redundant type of information, assuming the minimum actual remaining battery capacity adds up to be less than the first battery level threshold, as explained above.

A third example parameter that may be monitored by the computing device 100 at block 410 includes determining at least one of an age, power capacity and number of refresh cycles of the battery 130. As batteries age and/or their number of refresh cycles increase, their knee at the end of discharge may become more unpredictable. The knee at the end of discharge may refer to a response where the voltage level of the battery collapses quickly as the actual remaining battery capacity nears zero. The refresh cycle may refer to the charging and discharging of the battery. Different types of batteries may also have different power capacities. For example, a twelve cell battery may store more power than a six cell battery. Further, the power capacity of the battery may also decrease as the battery ages or the number of refresh cycles increase. As a result of the above, the computing device 100 may reserve a greater actual remaining battery capacity of the battery to increase a likelihood of a successful transition to the hibernate state.

Therefore, the computing device 100 may set the first modified remaining battery capacity to vary relative to the actual remaining battery capacity and/or set the first updated threshold level, based on at least one of the age, power capacity and number of refresh cycles of the battery 130 at block 420. For example, the computing device 100 may set the first modified remaining battery capacity to be less than the actual remaining battery capacity and/or the first updated threshold level to be greater than the first battery level threshold, as at least one of the age of the battery increases, the power capacity of the battery decreases, and the number of refresh cycles of the battery increases, assuming the minimum actual remaining battery capacity is greater than the first battery level threshold, as explained above.

A fourth example parameter that may be monitored by the computing device 100 at block 410 includes determining at least one of a temperature, processing speed, and power utilization of a component of the computing device 100. The power utilization is to vary based on at least one of a complexity of software running on the computing device 100, such as the first OS 145 or an application thereof, and a usage pattern of the computing device 100. For example, if the computing device 100 is being lightly used or being left unattended by the user, the utilization of the component may be lower than if the computing device was more actively used. The component of the computing device 100 may include for example, the processor 110.

The temperature of one or more components of the computing device 100 may have a direct and/or indirect impact on the time and energy required of the computing device 100 to enter the hibernate state. For example, a higher temperature may cause the computing device 100 to directly consume more power during operation compared to a lower temperature. Further, the higher temperature may indirectly lead to a longer time to enter the hibernation state if the processing speed of the processor 110 is lowered or throttled to prevent overheating. The throttling of the processor 110 may not only lead to slower performance by the processor 110 but also greater power consumption due to the longer time to enter the hibernation state.

Therefore, at block 420, the computing device 100 may set the first modified remaining battery capacity to vary relative to the actual remaining battery capacity and/or set the first updated threshold level based on at least one of the temperature, the processing speed and the power utilization of the component of the computing device 100. For example, the computing device 100 may set the first modified remaining battery capacity to be less than the actual remaining battery capacity and/or set the first updated threshold level to be greater than the first battery level threshold, as at least one of the temperature increases, the processing speed decreases and the utilization increases, assuming the minimum actual remaining battery capacity is greater than the first battery level threshold, as explained above.

A fifth parameter that may be monitored by the computing device 100 at block 410 includes determining at least one of a time and a power consumption to power down a peripheral device (not shown) connected to the computing device 100. The time to power down may include a time to save information of the peripheral device. The peripheral device may include a device attached to but not part of the computing device 100, such as a storage device, printer, digital camera, and the like. For example, the peripheral device may be a flash drive storing modified user data that is to be saved to the second memory 140 before the first OS 145 is to enter the hibernate state.

Therefore, at block 420, the computing device 100 may set the first modified remaining battery capacity to vary relative to the actual remaining battery capacity and/or the first update threshold value to be less than the first battery level threshold, based at least one of the time and power consumption to power down the peripheral device. For example, the computing device 100 may set the first modified remaining battery capacity to be less than the actual remaining battery capacity and/or the first update threshold value to be greater than first battery level threshold as at least one of the time and power consumption to power down of the peripheral device increases, assuming the minimum actual remaining battery capacity is greater than the first battery level threshold, as explained above.

In embodiments, the computing device may 100 monitor any combination of the one or more parameters listed above and/or other parameters related to power drawn to enter the hibernate state. For example, the power to be drawn by any of these parameters may be added together to determine the minimum actual remaining battery capacity to enter the hibernate state. If the minimum actual remaining battery capacity is less than first battery level threshold, the first modified remaining battery capacity may be set to be less than the actual remaining battery capacity of the battery in order to delay a time before the first OS 145 is to enter the hibernate state. Conversely, the first modified remaining battery capacity may be set to be greater than the actual remaining battery capacity of the battery if the minimum actual remaining battery capacity is greater than first battery level threshold, in order ensure the first OS 145 is able to complete a transition to the hibernate state.

FIGS. 5A and 5B are an example flowchart of a method 500 for reporting at least one of first and second modified remaining battery capacities and first and second updated threshold levels to first and second OSs 145 and 230. Although execution of the method 500 is described below with reference to the system 200, other suitable components for execution of the method 500 can be utilized, such as the computing devices 100 and 300. Additionally, the components for executing the method 500 may be spread among multiple devices (e.g., a processing device in communication with input and output devices). In certain scenarios, multiple devices acting in coordination can be considered a single device to perform the method 500. The method 500 may be implemented in the form of executable instructions stored on a machine-readable storage medium, such as storage medium 310, and/or in the form of electronic circuitry.

In the method 500 of FIGS. 5A and 5B, as explained above, the system 200 may include a hypervisor 220 to execute a plurality of virtual machines, such as the first OS 145 and second OS 230. In this scenario, at block 510, the hypervisor 220 receives a first battery level threshold from the first OS 145 and a second battery level threshold from the second OS 230, running on the system 200 powered by the battery 130. At block 520, the hypervisor 220 determines an actual remaining battery capacity of a battery 130 powering the system 200. At block 530, the hypervisor 220 monitors parameters of the first virtual machine including the first OS 145 and the second virtual machine including the second OS 230. The parameter of the first OS 145 can be power to be drawn by the system 200 for the first OS 145 to enter a hibernate state. A parameter of the second OS 230 can be power to be drawn by the system 200 for the second OS 145 to enter the hibernate state. The parameters vary with operation of the system 200.

The first OS 145 and second OS 230 may not be aware of each other. Thus, the first and second battery level thresholds may not take into account that an entirety of the actual remaining battery capacity of the battery 130 may not be available to each of the first and second OSs 145 and 230. Therefore, the system 200 may split the actual remaining battery capacity of the battery 130 between the first and second OSs 145 and 230. In order to better determine how to split the actual remaining battery capacity, monitoring the parameter of the first OS and the parameter of the second OS at block 530, may also include monitoring at least one of runtime percentage and user activity of the first OS 145 and second OS 230.

The runtime percentage may refer to a percentage of the time that the OS is running or active. A user activity may refer to an amount or percentage of the user's activity that is directed to the OS. For example, the first OS 145 may be running or active more often, such as 80% of the time, while the second OS 230 may be running or active less often, such as 20% of the time. In this case, the system 200 may apportion a greater portion of the actual remaining battery capacity to the first OS 145 when setting the first modified remaining battery capacity at block 540 below. The blocks 510, 520 and 530 may be carried out in a different order and/or simultaneously. Further, the blocks 510 and 520 may be omitted if the system 200 does not report the first or second modified remaining battery capacities.

The first and second modified remaining battery capacities of FIGS. 5A and 5B may be set similarly to the first modified remaining battery capacity description related to FIG. 4. The first and second updated threshold levels of FIGS. 5A and 5B may also be set similarly to the first updated threshold level description related to FIG. 4. For example, at block 540, the system 200 extends a time before the first OS 145 is to enter the hibernate state by setting at least one of the first modified remaining battery capacity and the first updated threshold level. The first modified remaining battery capacity is based on the first battery level threshold, the actual remaining battery capacity and the parameter of the first OS 145 and the first updated threshold level is based on the parameter of the first OS 145. At block 550, the system 200 extends a time before the second OS 230 is to enter the hibernate state by setting at least one of the second modified remaining battery capacity and the second updated threshold level. The second modified remaining battery capacity is based on the second battery level threshold, the actual remaining battery capacity and the parameter of the second OS 230 and first updated threshold level is based on the parameter of the second OS 230.

When determining the first and second modified remaining battery capacities at blocks 540 and 550, the system 200 splits the determined actual remaining battery capacity into a first power portion and a second power portion based on the monitored runtime percentage and user activity at block 530. The second modified remaining battery capacity is set based on the received second battery level threshold and one of the first and second power portions and sets the first modified remaining battery capacity based on another of the first and second power portions. For example, the system 200 may set the first modified remaining battery capacity to be greater than the second modified remaining battery capacity if the first OS 145 has at least one of a greater runtime percentage and user activity than that of the second OS 230. As a result, the second modified remaining battery capacity may reach the second battery level threshold of the second OS 230 sooner the first modified remaining battery capacity reaches the first battery level threshold of the first OS 145, allowing the first OS 145 to use a greater share of the actual remaining battery capacity. For instance, if the actual remaining battery capacity is 50%, the computing device 100 may report the first modified remaining battery capacity as 30% and the second modified remaining battery capacity as 20%.

On the other hand, the system 200 may set the second modified remaining battery capacity to be greater than the first modified remaining battery capacity if the second OS 230 has at least one of a greater runtime percentage and user activity than that of the first OS 145. When determining the first and second updated threshold levels at blocks 540 and 550, the system 200 may take into account the monitored runtime percentage and user activity at block 430. For example, the computing device may set the first updated threshold level to be lower than the second updated threshold level if the first OS 145 has at least one of a greater runtime percentage and user activity than that of the second OS 230. The system 200 may set the second updated threshold level to be lower than the first updated threshold level if the second OS 230 has at least one of a greater runtime percentage and user activity than that of the first OS 145.

Then, at block 560 the system 200 reports at least one of the first modified remaining battery capacity and the first updated threshold level to the first OS 145 and reports at least one of the second modified remaining battery capacity and the second updated threshold level to the second OS 230. Similar to the first OS 145, the second OS 230 is to enter the hibernate state if the second modified remaining battery capacity is less than the second battery level threshold and is to enter a sleep state if the second OS 230 receives a sleep command and the second modified remaining battery capacity is greater than or equal to the second battery level threshold. The second OS 230 is to vary the second battery level threshold based on the second updated threshold level.

By apportioning the actual remaining battery capacity of the battery 130 between the first and second OSs 145 and 230, the system 200 prevents or reduces the likelihood of the first and second OSs 145 and 230 from lacking sufficient power to transition to the hibernate state. Further, by providing different modified remaining battery capacities to the first and second OS 145 and 230, the system 200 prevents or reduces the likelihood of the first and second OS 145 and 230 attempting to simultaneously write information from the first memory 120 to a same location of the second memory 140.

At block 570, the system 200 determines first and second warnings based on the monitoring at block 530. The first and second warnings may further be determined based on the receiving and the determining at blocks 510 and 520. Then, the system 200 sends the first warning value to the first OS 145 at block 580 and sends the second warning value to the second OS 230 at block 590. The first warning value is to indicate the actual remaining battery capacity at which the first OS 145 is to warn the user that the battery 130 is low, and the second warning value is to indicate the actual remaining battery capacity at which the second OS 230 is to warn the user that the battery 130 is low. For example, if the first warning value is 10%, the first OS 145 may display a warning to the user that the actual remaining battery capacity of the battery 130 is low when the reported first modified remaining battery capacity or actual remaining battery capacity reaches 10%. The blocks 570, 580 and 590 may be omitted if the warning value is not to be changed and/or carried out simultaneously with blocks 540, 550 and 560.

With the above approaches, a time before the computing device is to enter the hibernate state may be delayed and a time the computing device is in the active state may be extended. For example, a parameter related to an amount of memory to be saved, an age and condition of the computing device, a speed and temperature of components of the computing device, complexity of software running on the computing device, an age and capacity of a battery and the like may be monitored. The parameter may be then be used to determine an amount to vary a modified remaining battery capacity relative to the actual remaining battery capacity of the battery and/or determine a updated threshold level. The modified remaining battery capacity may be reported to the OS, with the OS to interpret the modified remaining battery capacity as the actual remaining battery capacity of the battery and to enter the hibernate state if the modified remaining battery capacity is less than the battery level threshold. The updated threshold level may be sent to the OS to change a value of the battery level threshold. Thus, sending the modified remaining battery capacity and/or the updated threshold level may delay an amount of time before the OS transitions to the hibernate state.

What is claimed is:

1. A method, comprising:
   determining, by a computing device, a minimum battery level to transition the computing device to a reduced power state;
   determining, by the computing device, a modified remaining battery capacity based on the minimum battery level and an actual remaining battery capacity of a battery powering the computing device; and
   reporting, to an operating system, the modified remaining battery capacity in place of the actual remaining battery capacity.

2. The method of claim 1, wherein the reduced power state is a hibernate state, and wherein determining the modified remaining battery capacity comprises calculating, during operation of the computing device, a reserve level of the battery that is sufficient to power the computing device to enter and wake from a sleep state before entering the hibernate state.

3. The method of claim 1, further comprising:
   monitoring a parameter varying with operation of the computing device; and
   determining, during operation of the computing device, the minimum battery level based on the monitored parameter.

4. The method of claim 3, wherein the monitored parameter comprises an amount of information from a memory to be saved.

5. The method of claim 4, wherein the monitored parameter comprises priorities of redundant and non-redundant types of the information to be saved.

6. The method of claim 3, wherein the monitored parameter comprises at least one of an age, power capacity and number of refresh cycles of the battery.

7. The method of claim 3, wherein the monitored parameter comprises at least one of a temperature, processing speed, and power utilization of a component of the computing device.

8. The method of claim 1, further comprising:
   determining, by the operating system, to enter the reduced power state in response to a determination that the modified remaining battery capacity exceeds a first battery level threshold.

9. A computing device, comprising:
   a hardware processor; and
   a machine-readable storage medium storing instructions, the instructions executable by the hardware processor to:
      determine a minimum battery level to transition the computing device to a reduced power state;
      determine a modified remaining battery capacity based on the minimum battery level and an actual remaining battery capacity of a battery powering the computing device; and
      report, to an operating system of the computing device, the modified remaining battery capacity in place of the actual remaining battery capacity.

10. The computing device of claim 9, wherein the reduced power state is a hibernate state, and wherein the instructions are further executable to determine, during operation of the computing device, the modified remaining battery capacity based on a reserve level of the battery that is sufficient to power the computing device to enter and wake from a sleep state before entering the hibernate state.

11. The computing device of claim 9, the instructions further executable to:
   monitor a parameter varying with operation of the computing device; and
   determine, during operation of the computing device, the minimum battery level based on the monitored parameter.

12. The computing device of claim 9, wherein the monitored parameter comprises an amount of information from a memory to be saved.

13. The computing device of claim 12, wherein the monitored parameter comprises priorities of redundant and non-redundant types of the information to be saved.

14. The computing device of claim 9, wherein the monitored parameter comprises at least one of an age, power capacity and number of refresh cycles of the battery.

15. The computing device of claim 9, wherein the monitored parameter comprises at least one of a temperature, processing speed, and power utilization of a component of the computing device.

16. An article comprising a non-transitory machine-readable storage medium storing instructions that upon execution cause a processor to:

determine, during operation of a computing device, a minimum battery level to transition the computing device to a reduced power state;

determine a modified remaining battery capacity based on the minimum battery level and an actual remaining battery capacity of a battery powering the computing device; and report, to an operating system, the modified remaining battery capacity in place of the actual remaining battery capacity.

17. The article of claim 16, wherein the reduced power state is a hibernate state, and wherein the instructions are further executable to determine, during operation of the computing device, the modified remaining battery capacity based on a reserve level of the battery that is sufficient to power the computing device to enter and wake from a sleep state before entering the hibernate state.

18. The article of claim 16, the instructions further executable to:

monitor a parameter varying with operation of the computing device; and determine, during operation of the computing device, the minimum battery level based on the monitored parameter.

19. The article of claim 16, wherein the monitored parameter comprises at least one of an age, power capacity and number of refresh cycles of the battery.

20. The article of claim 16, wherein the monitored parameter comprises at least one of a temperature, processing speed, and power utilization of a component of the computing device.

* * * * *

UNITED STATES PATENT AND TRADEMARK OFFICE
CERTIFICATE OF CORRECTION

| | |
|---|---|
| PATENT NO. | : 10,061,380 B2 |
| APPLICATION NO. | : 15/159956 |
| DATED | : August 28, 2018 |
| INVENTOR(S) | : Keith A. Rogers et al. |

Page 1 of 1

It is certified that error appears in the above-identified patent and that said Letters Patent is hereby corrected as shown below:

On the Title Page

In Column 2, Primary Examiner, Line 1, delete "Jawreed A Abbaszadeh," and insert
-- Jaweed A Abbaszadeh, --, therefor.

Signed and Sealed this
First Day of January, 2019

Andrei Iancu
*Director of the United States Patent and Trademark Office*